United States Patent

Tohyama

[19]

[11] Patent Number: 6,050,836
[45] Date of Patent: Apr. 18, 2000

[54] SOCKET APPARATUS

[75] Inventor: Masao Tohyama, Gotemba, Japan

[73] Assignee: Texas Instruments Incorporated, Dallas, Tex.

[21] Appl. No.: 08/971,385

[22] Filed: Nov. 17, 1997

[30] Foreign Application Priority Data

Dec. 9, 1996 [JP] Japan .................................... 8-344701

[51] Int. Cl.$^7$ ................................................. H01R 11/22
[52] U.S. Cl. ......................................................... 439/266
[58] Field of Search ........................... 439/259, 263–266, 439/268, 330, 331

[56] References Cited

U.S. PATENT DOCUMENTS

| | | | |
|---|---|---|---|
| 5,482,471 | 1/1996 | Mori et al. | 439/263 |
| 5,498,970 | 3/1996 | Petersen | 439/268 X |
| 5,556,293 | 9/1996 | Pfaff | 439/266 |
| 5,669,780 | 9/1997 | Fukunaga | 439/266 |
| 5,690,281 | 11/1997 | Mori et al. | 439/268 |

*Primary Examiner*—Khiem Nguyen
*Attorney, Agent, or Firm*—Russell E. Baumann; Frederick J. Telecky, Jr.

[57] ABSTRACT

A socket (1) for burn-in tests of IC packages employs rack and pinion gears to drive contact makers (6). As a cover (3) is depressed against coil springs (38), a slide actuator member (4) with sliding portions (30, 32) is raised by rack (3b, 26a, 27a, 28a, 29a) and pinion gears (34, 35). Slide actuator member 4 includes grid members (4b) which bias the contact makers (6) into an open position when the actuator member is raised and allows the contact makers to close when the slide actuator member is lowered. Supporting surfaces (30d, 32d) of the sliding parts (30, 32) of the slide actuator member are raised higher than interdigitated loading surfaces (20a, 21a) of guide elements (20, 21) of the base (2) so that the IC package (5) can be easily positioned by the supporting surfaces (30d, 32d) without engaging the ball terminals (5b) with arms (6a, 6b) of contact makers (6). Cover (3) begins to move upwardly when the downward force on the cover is released, while the slide actuator member (4) moves downwardly. Subsequently, the IC package (5) is precisely positioned on loading surfaces (20a, 21a) by the guiding surfaces (20b, 21b) since the supporting surfaces (30d, 32d) are lowered below the loading surfaces (20a, 21a), simultaneously the ball terminals (5b) are clamped by the arms (6a, 6b). In a second embodiment the contact makers (6) of socket (1A) are arranged obliquely relative to the sides of the slide actuator member allowing a contact arrangement having a finer pitch. In a third embodiment the slide actuator member (4") is formed integrally with the cover (3"). A modified embodiment shows a modified contact maker (60) formed with a constriction and with a grid member (4b"') of the slide actuator member received in between respective arms (60a, 60b) for controlling the open and closed position of the contact maker.

12 Claims, 11 Drawing Sheets

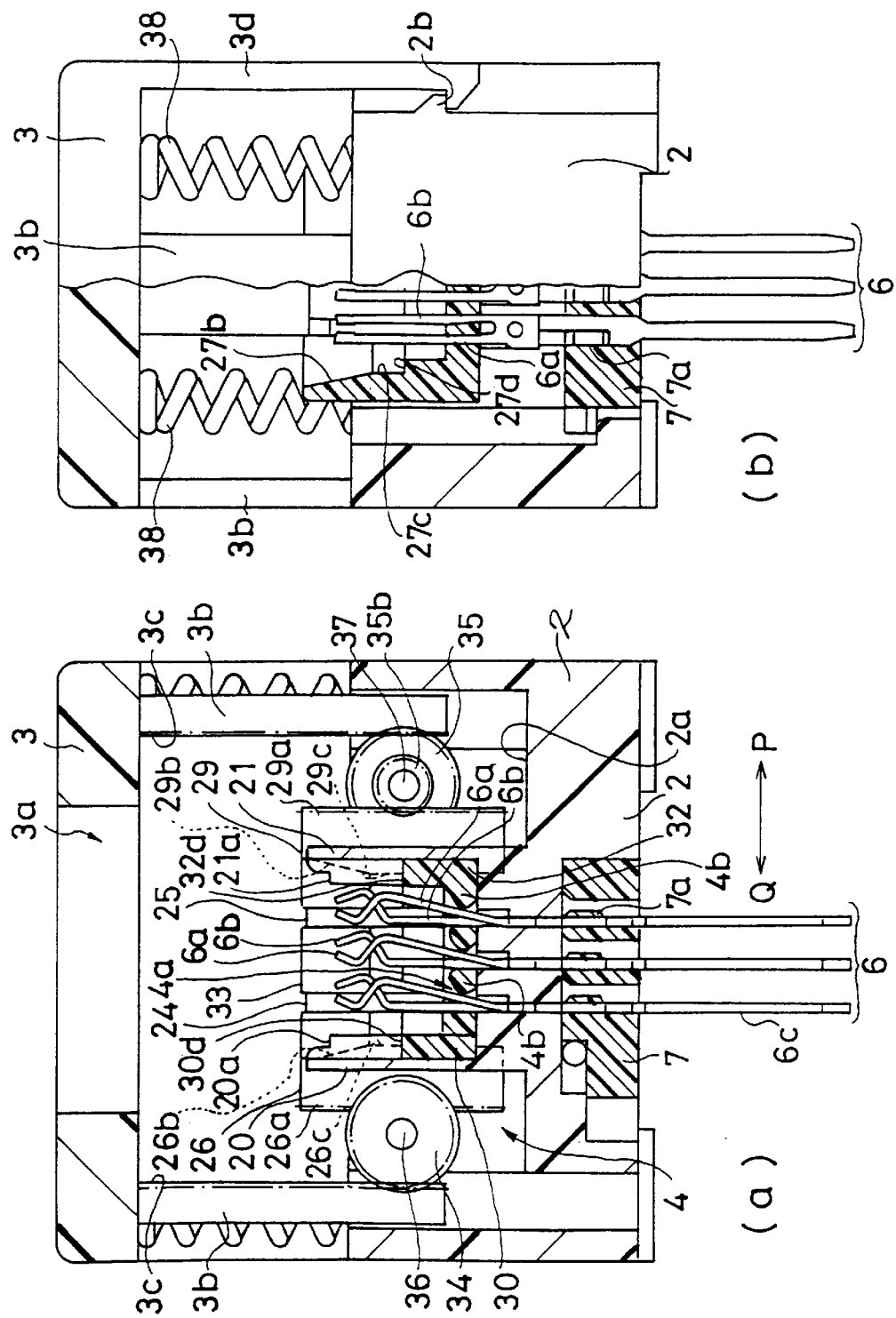

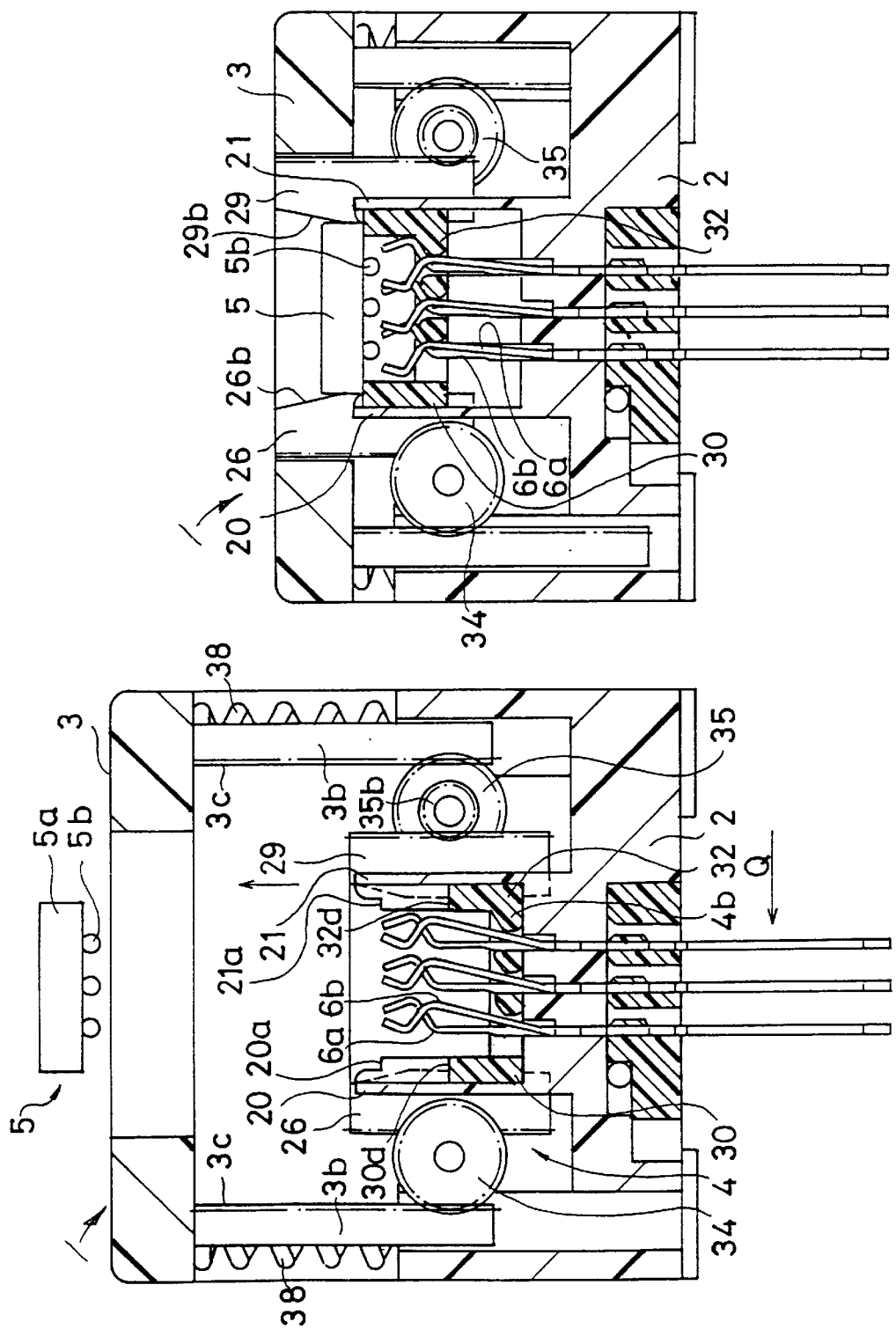

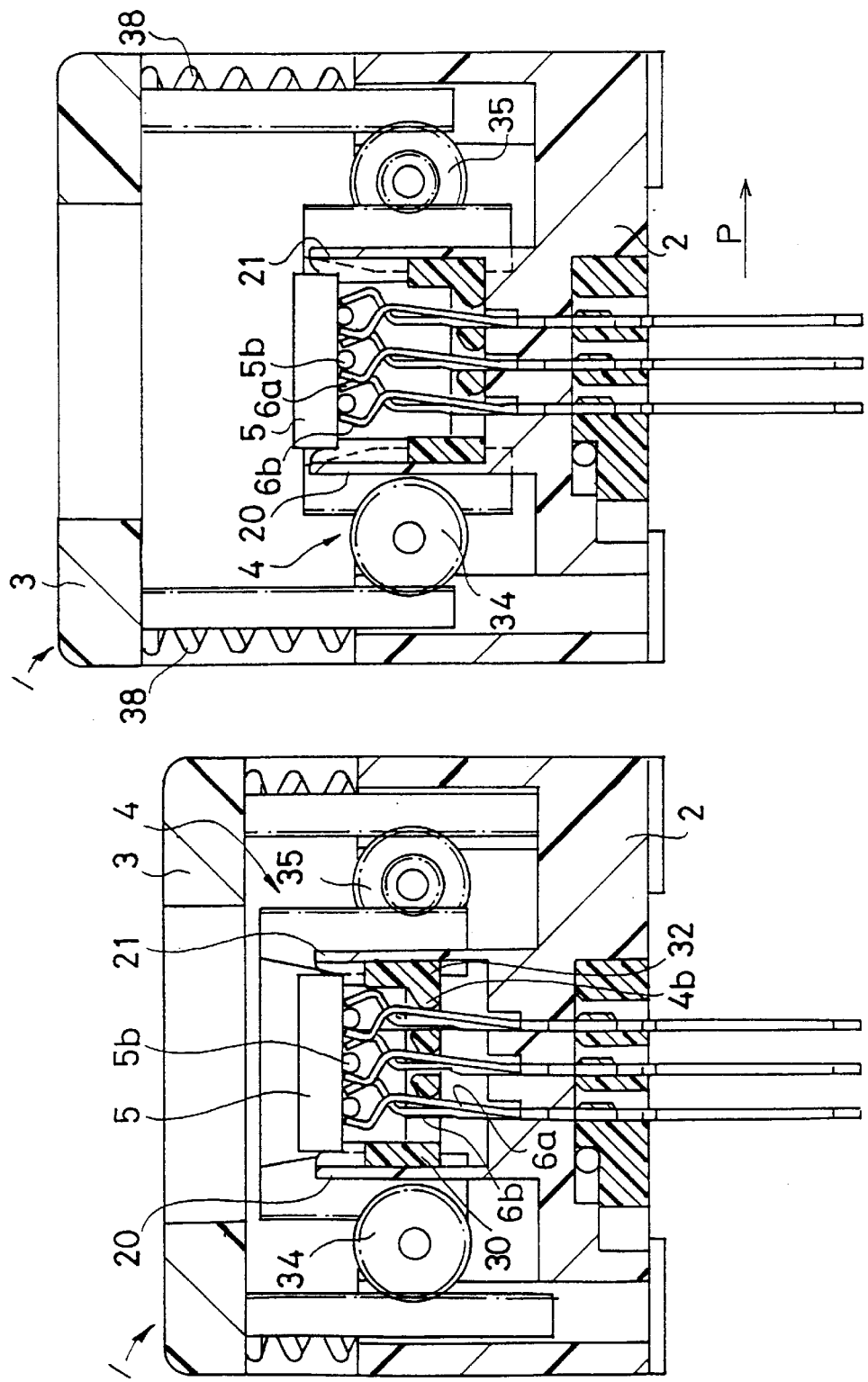

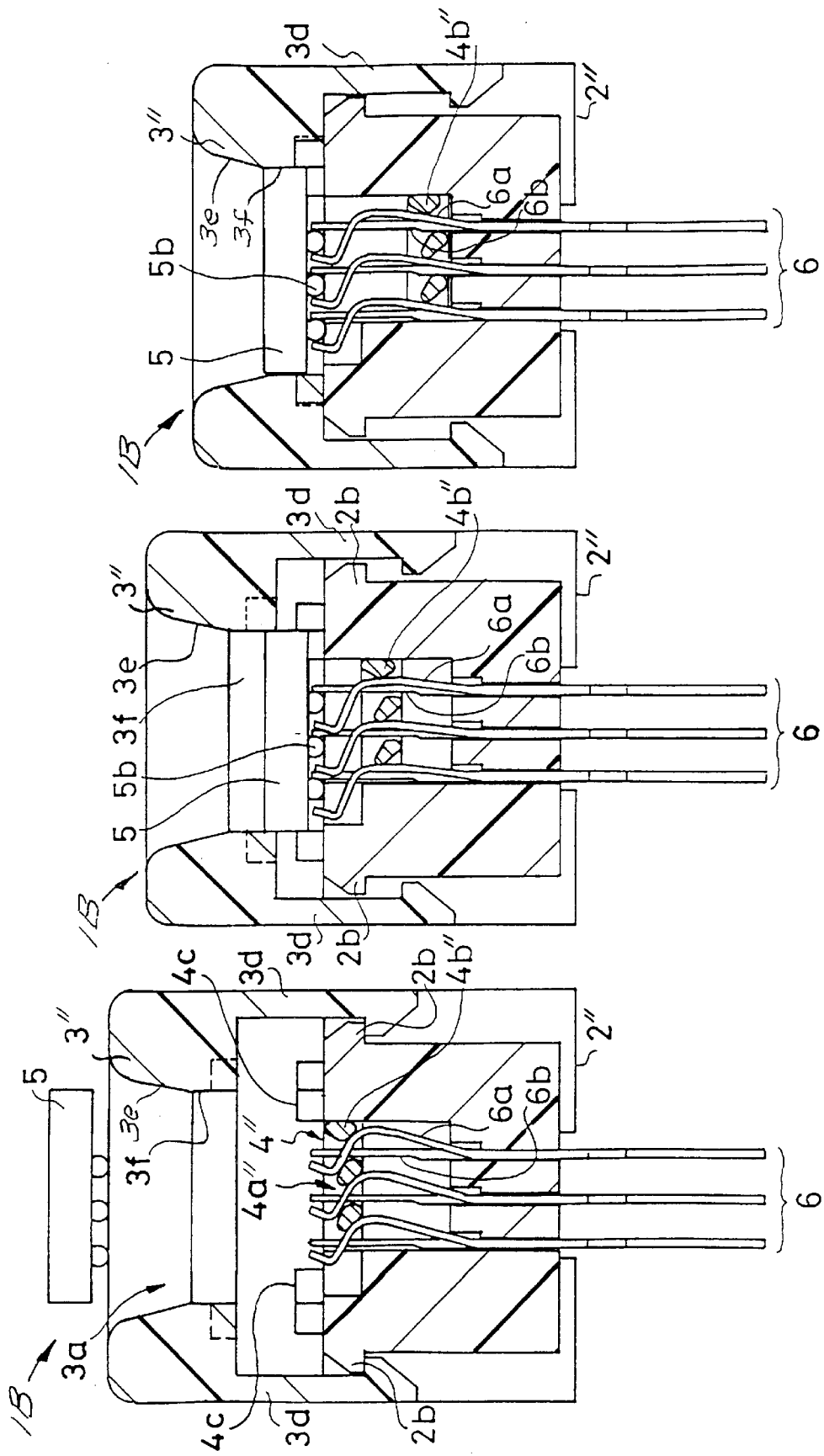

SOCKET APPARATUS

FIELD OF THE INVENTION

This invention relates to a socket for providing electrical connection for testing purposes between each terminal lead of an electronic integrated circuit (IC) package having multiple terminal leads and external equipment upon removably loading the package into the socket.

BACKGROUND OF THE INVENTION

It is conventional, as part of the manufacturing process, after integrated circuits have been sealed in plastic packages to subject the devices to selected tests prior to shipment to enable differentiation between satisfactory and unsatisfactory products. Input and output characteristics of the IC chips, pulse characteristics, noise leeway and the like, are tested in an electrical property test. Those IC devices that pass the electrical property test are then subjected to a burn-in test in which the devices are arranged in an oven and caused to perform for a selected period of time under a power source voltage which is approximately 20 per cent higher than their rated value and at an elevated temperature, for example, 120° C. Those IC devices that fail to perform satisfactorily in the burn-in test are discarded as being unsatisfactorily and only those products which continue performing normally are shipped out as satisfactory.

An electronic integrated circuit package, known as a ball grid array (BGA) package, in which ball-shaped terminal leads (solder balls) are arranged in a selected matrix on the bottom side of the package, has become popular in recent years as a new surface loading type of IC package. The BGA package has an advantage in that the pitch of the terminals can be increased and the terminal leads are sturdier and more difficult to deform by contact with other members.

FIGS. 11 through 15 show conventional sockets used for burn-in tests of such BGA packages. As shown in FIG. 11, socket 101 has a resinous base 102 in the shape of a rectangle on which a slider 104 is movably mounted in a horizontal direction, i.e., parallel to the y arrow of FIG. 11, for loading a BGA package 105 (FIG. 15(a)). Slider 104 has a recessed holding part 104a (FIGS. 15(a)–15(c)) with an aperture corresponding to each lead terminal 105b of BGA package 105 formed in its bottom wall. In addition, a contact maker 106 is fixed to base 102 and extends through each aperture. Contact makers 106 are elongated metallic members each having a pair of arms 106a and 106b (FIG. 11 (a)) provided at one end thereof. Each contact maker 106 is vertically fixed on base 102, with arms 106a and 106b facing upwardly.

A cover 103 made of resin and having a centrally disposed opening 103a is movably mounted on base 102 in the vertical direction relative to the base and biased upwardly by a compression coil spring 136 provided at each of four corners. A slide mechanism is provided on both sides of slider 104 for moving the slider in parallel with the bottom wall of base 102. A generally L-shaped arm 107 is rotatably mounted at one end of base 102 at 108 and is rotatably linked to a shaft 109 that engages with an end portion of slider 104. One end of a lever 110 is rotatably mounted on shaft 111 as the center at an opposed end portion of base 102. The tip end part of arm 107 is movably connected to lever 110 through a slot located intermediate the ends of the lever by means of a pin 112. The distal end tip part of the arm 110 engages the margin of the wall defining the opening in cover 103 when cover 103 is in its raised position. Moreover, compression coil springs 113 (FIG. 11) are provided on the shaft 111 side of the slider to place a bias on slider 104 in the y direction as seen in FIG. 11.

When cover 103 is pushed down from the position shown in FIG. 15(a) to the FIG. 15(b) position, lever 110 rotates toward base 102 and slider 104 moves in the direction indicated by arrow H in conformity with the movement of the arm 107 and shaft 109. As a result, arms 106a and 106b of contact makers 106 are pushed by grid or lattice parts 104c to open (FIG. 11(a)). If a BGA package 105 is dropped into holding part 104a of slider 104 in this state, as shown in FIG. 15(b), terminal leads 105a of BGA package 105 enter the respective gaps between arms 106a and 106b. When the downward force against cover 103 is removed, lever 110 and arm 107 rise as shown in FIG. 15(c), with slider 104 being returned in a direction which is opposite to the direction indicated by arrow H, with a result that arms 106a and 106b of each contact maker 106 are closed and that each terminal lead 105b of BGA package is held by arms 106a and 106b of a respective contact maker 106. As a result of this, each terminal lead 105b of BGA package can be electrically connected to a respective contact maker 106 in a satisfactory manner. BGA package 105 can be easily removed from the socket by pressing the cover downwardly.

A socket according to prior art as described, nevertheless, has the following problems: The use of the link mechanism comprising lever 110 and arm 107, employed as a means for moving the slider 104, results in an increased number of parts as well as an increase in manufacturing cost and results in a more complicated assembling operation. Further, because slider 104 moves in a direction parallel to the bottom wall of base 102, it is necessary to provide space for movement of slider 104 between open and closed positions of contact makers 106 and this has prevented the pitch between the contact makers 106 from being reduced. Those BGA packages 105 which have little space between terminal leads 105b present a problem in that respective terminal leads 105a tend to enter the gap between the arms of two different contact makers 106 upon being loaded in the socket with a result that it becomes difficult for BGA package 105 to be inserted. In addition, since the electrical connection is effected by sandwiching the terminal leads 105a of the BGA package, there have been cases where terminal leads 105b have fused to contact makers 106 at the time of a burn-in test, thereby making it difficult for the BGA package 105b to be taken out.

SUMMARY OF THE INVENTION

It is an object of the invention to provide a socket which overcomes the above noted limitations of the prior art. Another object of the invention is the provision of a small-sized socket having a simple construction with a small number of parts. Yet another object of the invention is the provision of a socket in which an electrical part such as the BGA package or the like, can be easily inserted and removed. Other objects, advantages and details of the socket of this invention appear in the following detailed description of preferred embodiments of the invention.

Briefly described, a socket made in accordance with the invention comprises a main socket body for removably loading an IC device having terminal leads arranged in a selected pattern in which a plurality of contact makers are mounted in the socket body, each having a pair of switchable, arm-like contact parts for pressure contact with a respective terminal lead of the IC device and being arranged in conformity with the pattern of the terminal leads of the IC device. A slide actuator member is provided which includes a contact switching means for opening and closing the arm-shaped contact parts of the contact makers in conformity with the vertical movement of a cover movably received on the socket body. According to a feature of the invention, a supporting surface for the IC device is provided on the slide actuator member which moves from one side of a plane in which a loading surface of the main socket body lies to an opposite side of the plane causing the arm-shaped contact parts of the contact maker to open when the supporting surface of the slide actuator member is located above the loading surface of the main socket body and to close the arm-shaped contact parts of the contact maker when the supporting surface of the slide actuator member is located below the loading surface of the main socket body. According to another feature of the invention, a moving mechanism for moving the slide actuator member in the vertical direction in linkage with the cover is provided comprising rack and pinion gears. In a modified embodiment, the slide actuator member may be formed integrally with the cover body. According to the invention, a positioning surface for positioning an IC device may be provided adjacent the supporting surface of the slide actuator member and a positioning surface for the positioning of the IC device may be provided adjacent the loading surface on the main socket body. Furthermore, the slide actuator member may have an arm switching portion disposed within the slide actuator member, thereby making it possible for the arm-like contact parts of the contact maker to be opened or closed by the arm switching portion. The arm-shaped contact parts of the contact maker are opened and closed by the arm contact switching portion in conformity with the movement of the slide actuator member. According to this invention, therefore, there is no need to have a linkage mechanism for moving the slide actuator member in the opening and closing direction of the arm-shaped contact parts as in the conventional example, with a result that the construction becomes simpler and the number of parts required can be reduced.

When an IC device is to be loaded in the socket, the device is placed and positioned on the supporting surface of the slide actuator member when the supporting surface is disposed above the loading surface of the main socket body. In this state, the contact parts of the contact makers open allowing insertion of the lead terminals of the IC device. When the slide actuator member and IC device are lowered and the positioning of the IC device adjusted, the lead terminals will not be inserted into the arm-like contact parts of a contact maker adjacent to the intended one or in between contact makers so that the IC device can be inserted smoothly. When the slide actuator member is lowered still further, the supporting surface of the slide member passes through the plane which includes the loading surface of the main socket body and the IC device is transferred from the supporting surface of the slide member to the loading surface of the main socket body. In this state, the supporting surface of the slide actuator member is disposed below the loading surface of the main socket body, with the arm-shaped contact parts closed and the lead terminals of the electrical part are held by the arm-shaped contact part.

When the IC device is to be removed from the main socket body, the slide actuator member that is situated below the loading surface of the main socket body is raised with the slide actuator member passing through the plane which includes the loading surface of the main socket body, with a result that the arm-shaped contact parts of the contact makers are opened and, at the same time, the IC device is forcefully transferred from the loading surface of the main socket body to the supporting surface of the slide actuator member. As a consequence of this, the IC device is moved to the supporting surface of the slide actuator member, even in the event where a lead terminal of the IC device and the arm-shaped contact parts of the contact maker may have become fused in a burn-in test, or the like, and as a result, can then be easily removed from the supporting surface.

In certain embodiments the slide actuator member is moved up and down using a simple rack and a pinion mechanism in order to load and unload the IC device. In another embodiment in which the slide member is integrally formed with the vertically movable cover, a moving mechanism for separately moving the slide actuator member is obviated. Furthermore, in an embodiment which includes a positioning part for positioning the IC device on the supporting surface and a positioning part for positioning the IC device on the loading surface in the main socket body, accurate positioning of the IC device can be carried out in connection with the movement of the IC device from the supporting surface of the slide member to the loading surface of the main socket body, with a result that the terminal leads can be accurately shifted to the desired position in between the arm-like contact parts of the contact makers.

Meanwhile, in an embodiment which includes a slide actuator member with an arm opening and closing switching means provided within the slide actuator member for opening and closing the arm-shaped contact parts of the contact makers, it is easily possible for the arm-shaped contact parts to open and close against the contact terminal leads of an IC device having a small pitch. The switch direction of the arm-like contact part may constitute a prescribed angle, for example, 45° relative to a side of the slide actuator member so that it becomes possible for the arm-shaped contact parts themselves to be closer together.

BRIEF DESCRIPTION OF THE DRAWINGS

Other objects, advantages and details of the novel and improved socket of this invention appear in the following detailed description of preferred embodiments of the invention, the detailed description referring to the drawings in which:

FIG. 3(a) is a cross section taken along lines A—A in FIG. 1 and FIG. 3(b) is a partial cross section of the socket shown in FIG. 1 as viewed from the direction indicated by arrow X;

FIGS. 4(a) through 4(d) are cross sections taken along line A—A in FIG. 1 to show alternate positions of the socket as a BGA package is being loaded into the socket;

FIGS. 9(a) through 9(c) are cross sectional views to show alternate positions of another embodiment of the invention;

DETAILED DESCRIPTION OF PREFERRED EMBODIMENTS

Figure 1:
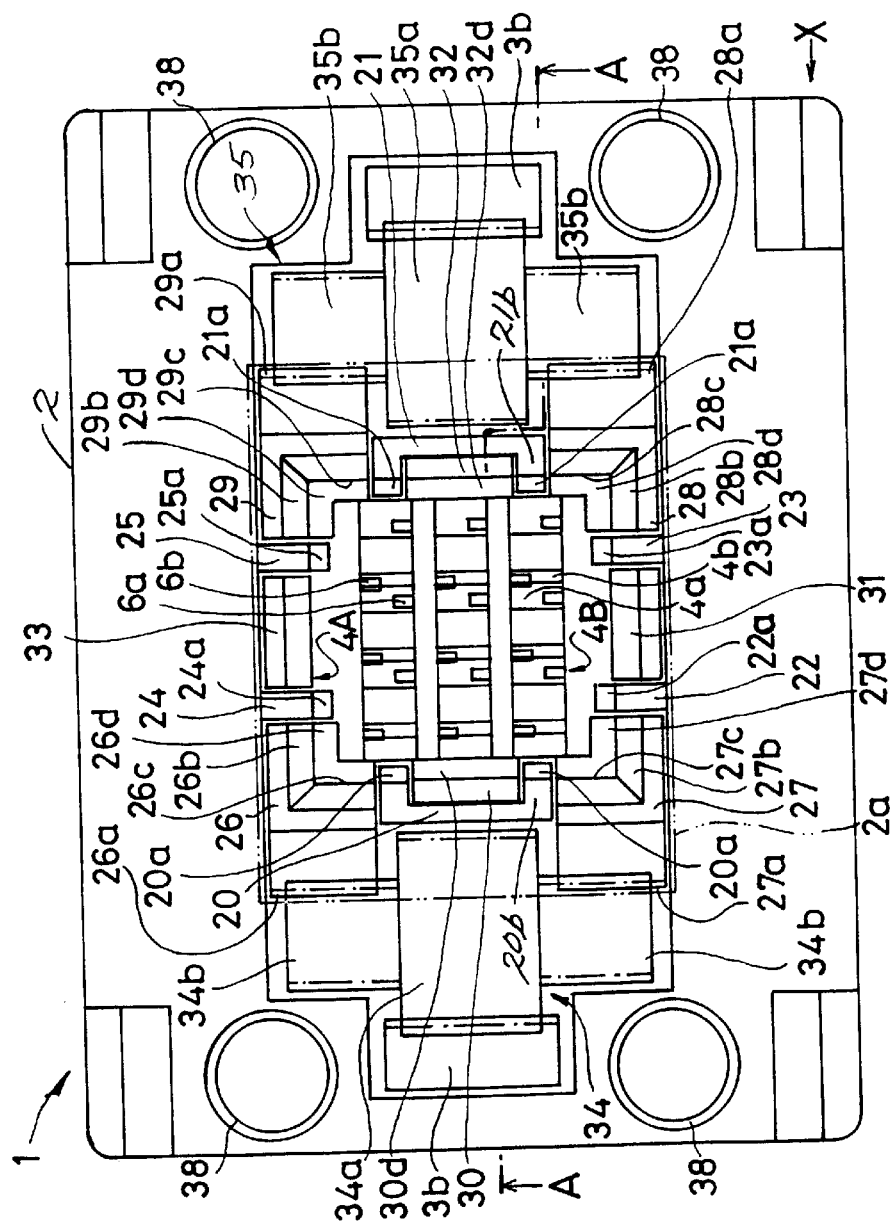
FIG. 1 is a top plan view showing a socket made according to this invention.

With respect to FIGS. 1, 3(a) and 3(b), socket 1, made in accordance with a first embodiment of the invention, comprises a base 2 as a main socket body, a cover 3 and a slide actuator member 4, which are formed using suitable resinous material such as polyetherimide, or the like, to cite an example. Base 2 is fixed on a suitable circuit substrate such as a printed substrate, or the like in a conventional manner and is formed in the shape of a rectangle, for example. Cover 3 is mounted on base 2 vertically movable relative to the base and is provided with an opening approximately at the center thereof for loading and removing BGA packages 5. Four compression coil springs 38 are disposed between cover 3 and base 2. As shown in FIG. 3(b), the compression coil springs are partially compressed in the state where latches 3d, provided at four corners of cover 3, are engaged with stop members 2b provided on base 2.

Figure 2:
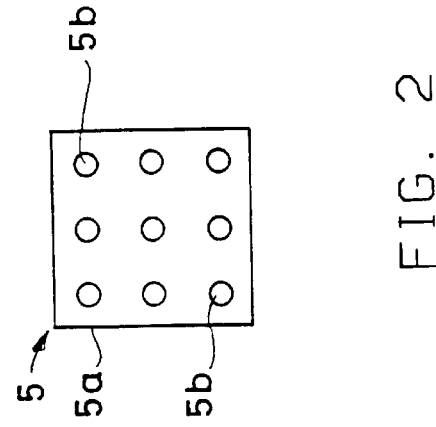
FIG. 2 is a bottom plan view of a BGA package useful with the invention.

A BGA package with which this invention is intended for use contains an IC chip (not shown) sealed in a generally square resinous package 5a shown in FIG. 2 with ball-shaped terminals 5b provided in a selected matrix pattern forming a large number of terminal leads (nine terminal leads shown for illustration) on its bottom surface.

A plurality of contact makers 6 are provided approximately at the center of base 2 arranged in a pattern which corresponds with the pattern of solder balls 5b of BGA package 5 and are made of a suitable metal such as beryllium copper. Contact makers 6 have the same construction as in the conventional example, referenced supra, and are prepared by punching a thin sheet of spring plate material as shown in FIGS. 3(a) and 3(b) with each formed in such a way as to extend as a pin 6c in one longitudinal direction from the center and to extend from the center in the opposite longitudinal direction divided into a pair of arm-like contact parts 6a, 6b. Each contact maker 6 is held vertically fixed in bottom wall 2a of base 2. Each respective pair of arms 6a and 6b can be flexibly opened or closed in the directions indicated by double arrow QP in mutually opposite directions and comprises contact parts for pressure contact by sandwiching a respective solder ball 5b of BGA package 5. As shown, arm 6b extends in a straight line from pin 6c toward the distal free end or contact part which is formed with a concave portion facing in the direction indicated by arrow Q. The mating arm 6a is bent from the center of contact maker 6 in the direction indicated by arrow P and is formed with a concave portion facing in the direction indicated by arrow P aligned with and facing the concave portion in arm 6b. Each contact maker 6 is constructed in such a manner that its downward movement is restricted by means of protuberant part 7a of stop member 7 provided at the bottom of base 2.

Guide elements 20, 21, 22, 23, 24 and 25 are formed integrally with base 2 and extend vertically upwardly from wall 2a and serve to guide slide actuator member 4 relative to contact makers 6. Guide elements 20 and 21, located on opposite sides of contact makers 6 in the opening and closing direction of arms 6a and 6b have a generally U-shape as viewed from above, as shown in FIG. 1. Horizontal loading surfaces 20a and 21a are formed at the top of the flanges of respective guide elements 20 and 21 and serve as loading surfaces for the loading of BGA package 5 as will be described below. Guide elements 22, 23, 24 and 25 are formed in the shape of pillars with loading surfaces 22a, 23a, 24a and 25a formed at the top of respective guide elements 22, 23, 24 and 25 for loading BGA package 5.

Slide actuator member 4 is movable in the vertical direction relative to bottom wall 2a of base 2 in cooperation with guide elements 20 through 25. Slide actuator member 4 is preferably integrally formed and, as shown in FIG. 1, comprises, in top plan view, an approximately square slide member 4A guided by guide elements 20 through 25. Contact switching means 4B for opening and closing arms 6a and 6b of contacts 6 are formed as a grid inside slide member 4A, to be discussed below. Slide member 4A comprises integrally formed slide corner portions 26, 27, 28 and 29 at respective corners of the slide member and slide portions 30, 31, 32 and 33 which are sandwiched therebetween. Gear rack members 26a, 27a, 28a and 29a are integrally formed with respective slide portions 26, 27, 28 and 29 and engage with small gear portions 34b and 35b of pinion gears 34 and 35 respectively controlling the vertical position of actuator member 4 to be further described below. Slide portions 30 and 32, positioned between slide portions 26, 27, 28 and 29 respectively, slide on the inner surfaces of the guide elements 20 and 21 of base 2. Inclined positioning surfaces 26b, 27b, 28b and 29b are formed on respective slide portions 26, 27, 28 and 29 for guiding BGA package 5 and cover an area somewhat larger than the outside shape of the BGA package to be loaded. Vertically disposed positioning surfaces 26c, 27c, 28c and 29c extend downwardly from the lower portion of respective inclined surfaces 26b, 27b, 28b and 29b of the slide members as shown in FIGS. 3(a) and 3(b) for positioning the BGA package on a temporary basis. Horizontal supporting surfaces 26d, 27d, 28d, 29, 30d and 32d of respective slide portions 26, 27, 28, 30 and 32 for supporting BGA package 5, lie in a common plane parallel with bottom wall 2a of base 2. Contact arm opening and closing switching means 4B of actuator member 4 is formed generally as a lattice or grid and has an aperture 4a formed therethrough for the insertion of each contact maker 6 in correspondence with each terminal 5b of BGA package 5. The distance or span of each aperture in the opening and closing direction of arms 6a and 6b is smaller than the maximum span between arms 6a and 6b. The aperture walls preferably have a curved surface formed on each lattice part 4b on the side thereof indicate by arrow mark Q which serve as arm opening and closing parts.

Pinion gears 34 and 35 are provided on both sides of slide actuator member 4, as shown in FIG. 3(a), and provide vertical movement of slide actuator member 4. Pinions 34 and 35 each have separate sections having different diameters and different numbers of teeth combined on the same core, with the number of teeth on gear parts 34a and 35a at the center being greater than the number of the teeth of the small-sized gears 34b and 35b on the sides. Gears 34 and 35 are mounted on base 2 in such a way as to be freely rotatable about respective axes 36 and 37 and each small gear part 34b and 35b are engageable with respective rack members 26a, 27a, 28a and 29a of actuator member 4. A slider 3b extends vertically from the lower surface at both ends of cover 3 in the longitudinal direction. A rack member 3c is provided on the inside portion of each slider 3b so the rack members are engageable with respective gear parts 34a and 35a of gears 34 and 35.

The operation of socket 1 of the first embodiment will be explained by referring to FIGS. 4(a) through 4(d) and FIGS. 5(a) through 5(c). Socket 1 is mounted on a suitable circuit substrate, not shown in the drawing. When cover 3 is not depressed, as shown in FIG. 4(a), cover 3 is positioned at its upper extremity by the force of compression coil springs 38. In this state, arms 6a and 6b of each contact maker 6 are in the closed position. When cover 3 is pressed down from this position, gears 34 and 35 that are engaged with rack members 3c of slider 3b, rotate in a first direction. The small gear parts 34b and 35b engage rack members 26a, 27a, 28a and 29a and cause the slide actuator member 4 to rise. As cover 3 is depressed, each lattice part 4b of arm opening and closing switching means 4B of slide actuator member 4 engages a respective arm 6b of contact makers 6, thereby biasing the arms in the direction indicated by arrow Q, with a result that both arms 6a and 6b of the contact 6 start opening. FIG. 4(b) shows cover 3 depressed to its lowest extremity. In the FIG. 4(b) position, slide actuator member 4 is raised to the upper surface of cover 3. Meanwhile, arms 6a and 6b open widely to readily receive respective solder balls 5b of BGA package 5. Supporting surfaces 26d, 27d, 28d, 29d, 30d and 32d respectively provided on the slide parts of slide actuator member 4 are higher than loading surfaces 20a and 21a on guide elements 20 and 21 of base 2. In this state, BGA package 5 is dropped from above, with solder balls 5b facing downwardly.

As a consequence, package part 5a is guided along the inclined surfaces 26b, 27b, 28b and 29b of the slide actuator member 4 to be placed on supporting surfaces 26d, 27d, 28d, 29d, 30d and 32d. In this state, each solder ball 5b of the BGA package is held at a height out of engagement with arms 6a and 6b of contact makers 6 and, moreover, the lower surface of package part 5a is positioned so that it is parallel with a plane in which the distal free ends of arms 6a and 6b lie.

Figures 5A, 5B, 5C:
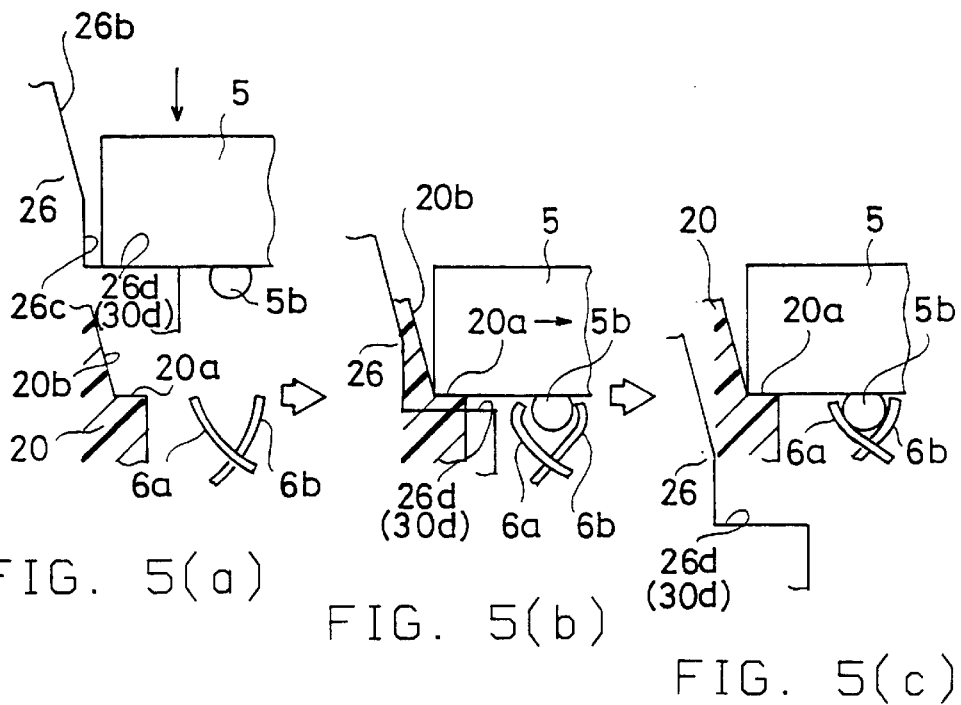
FIGS. 5(a) through 5(c) are broken away portions of a BGA package and socket 1 in alternate positions related to FIGS. 4(a)–4(d)

When the downward force on cover 3 is removed, cover 3 is raised through the stored force of compression coil springs 38 and gears 34 and 35 that engage rack member 3c of slider 3b rotate in a second, opposite direction, with a result that the slide actuator member 4, engaged with the small gears 34b and 35b, descends. This action results in BGA package 5 being transferred from supporting surfaces 26d, 27d, 28d, 29d, 30d and 32d to interdigitated loading surfaces 20a and 21a of guide elements 20 and 21 of base 2 as the slide part supporting surfaces of slide actuator member 4 move lower than loading surfaces 20a and 21a of the guide of base 2 as shown in FIGS. 4(c) and 5(c), for example. In this case, the inclined positioning surfaces 20b and 21b formed on guide elements 20 and 21 of base 2 inside the positioning surfaces 26c, 27c, 28c and 29c of slide members 26, 27, 28 and 29 of slide actuator member 4, as shown in FIGS. 5(a) and 5(b), will accurately position BGA package 5 so that each solder ball 5b is accurately received between arms 6a and 6b of each respective contact maker 6. Slide actuator member 4 continues down thereafter and stops upon engagement with bottom wall 2a (FIG. 4d). In this position of slide actuator member 4, arm 6b of each contact maker and lattice part 4b of the respective arm opening and closing switching means 4B of slide actuator member 4 are separated from on another with a result that arm 6b of each contact maker 6 moves in the direction indicated by arrow P so that arms 6a and 6b are closed by their own spring bias and sandwich respective solder balls 5b in compressing engagement. This results in a satisfactory electrical connection between each solder ball 5b of BGA package 5 and arms 6a and 6b of a respective contact maker 6 as shown in FIG. 5(c). Cover 3 then is raised to a preselected position by the stored energy of compression coil springs 38. In this position, various tests and inspections are conducted on the BGA package. When the BGA package is to be taken out, cover 3 is depressed to a prescribed position thereby raising slide actuator member 4 and opening arms 6a and 6b. BGA package 5 is then transferred from loading surfaces 20a and 21 a of guide elements 20 and 21 of base 2 to supporting surfaces 26d, 27d, 28d, 29d, 30d and 32d of slide actuator member 4 until it reaches the position which is shown in FIG. 4(b). Then, BGA package 5 is taken out by using a vacuum pic, to cite an example.

According to the embodiment of the invention described above, the bottom side of BGA package 5 is held in parallel relation with the free distal ends of contact arms 6a, 6b by slide actuator member 4, further positioned more accurately and then lowered with solder balls 5b inserted between arms 6a and 6b, so that BGA package 5 can be loaded firmly and smoothly without the danger of the solder balls 5b of BGA package 5 being inserted between arms 6a and 6b of two different contact makers or the arms of unintended contact makers. In the case where the BGA package 5 is to be removed, moreover, BGA package 5 is forcefully raised by the rising slide actuator member 4 so that even if a solder ball 5b becomes fused with arms 6a and 6b of a contact maker 6, it can easily be separated. According to this embodiment, therefore, the BGA package can be removed smoothly at all times. According to this embodiment of the invention, moreover, the construction is simple and the number of parts involved is small and the socket can be reduced in size and in cost because the link mechanism used in the prior art example is not used. Further, only a small force is needed to move slide actuator member 4 up and down by using gears 34 and 35 having different diameters or steps. By properly selecting the number of teeth of gear parts 34a and 35b and small gear parts 34b and 35b of gears 34 and 35, it becomes possible to adjust the length of stroke of cover 3 and slide actuator member 4.

It should be noted that this invention is not limited to the above described embodiment and can be modified variously. For example, it is possible to use gears of the same diameter, that is without any steps. The use of steps, however, makes it easier to move slide actuator member 4 and, at the same time, to optimize the length of stroke of cover 3 as well as slide actuator member 4. The means for moving slide actuator member 4 is not limited to gears but instead, a friction wheel, a rubber roller, a chain, a belt, or the like can be used, if desired. In addition, the contact makers are not limited to the above described embodiment.

Figure 6:
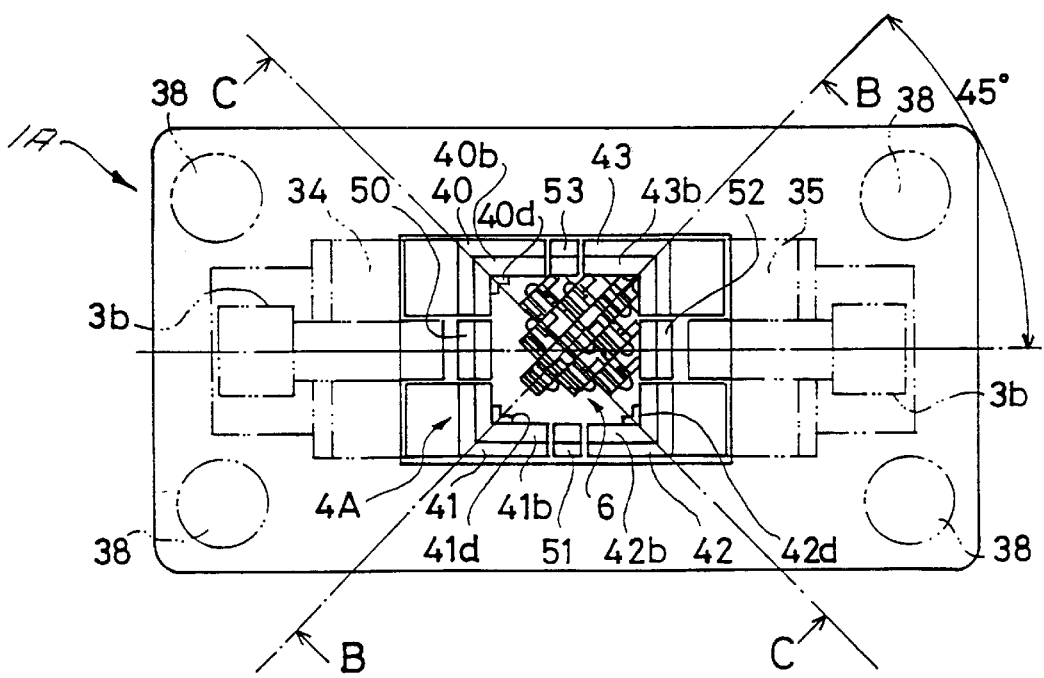
FIG. 6 is a top plan view showing a modified embodiment of the invention.
Figure 8:
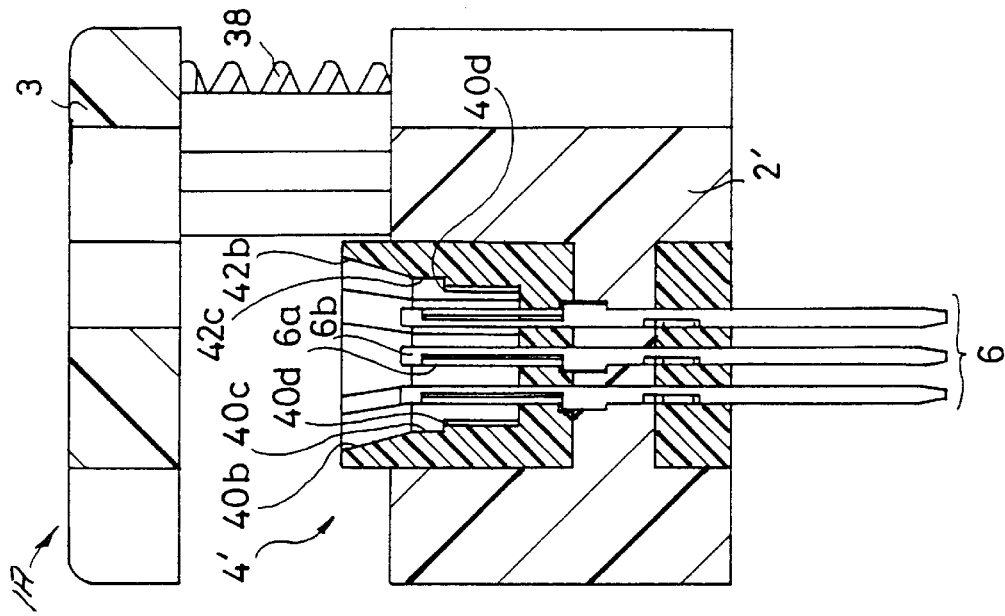
FIG. 8 is a cross section taken along line C—C in FIG. 6.
Figure 7:
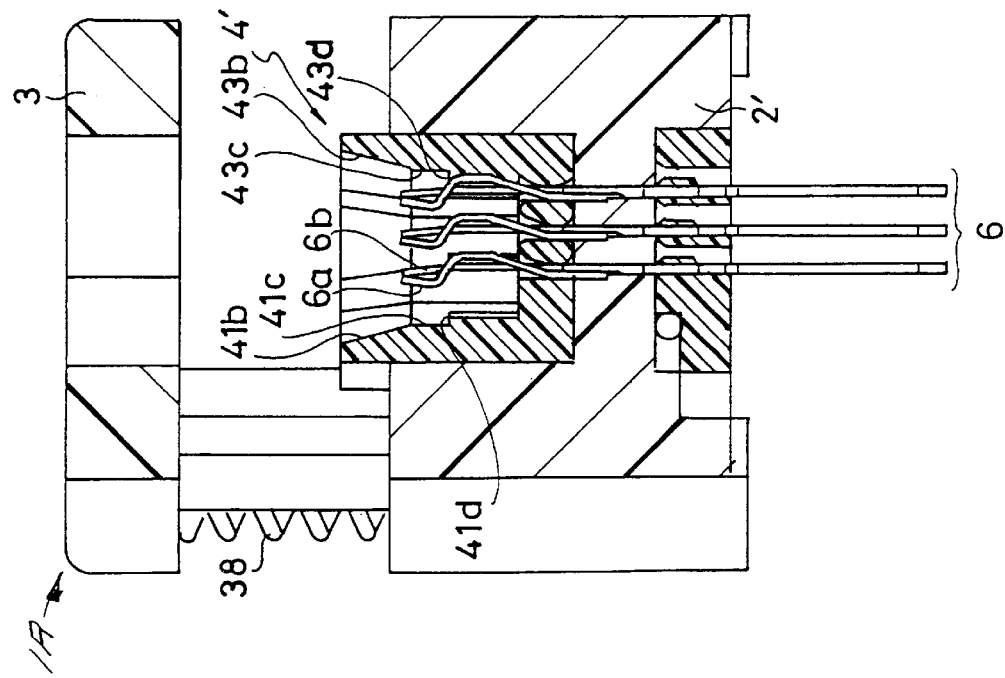
FIG. 7 is a cross section taken along line B—B in FIG. 6.

FIGS. 6–8 show an alternate embodiment of the socket made according to this invention. The following explanation will be given by using the same reference characters for those parts which correspond to the first described embodiment. Socket 1 A made in accordance with the alternate embodiment has (in top plan view) a generally square-shaped slide part 4A' of the slide actuator member 4' as in the case of the FIG. 1–5 embodiment, however, the opening and closing direction of arms 6a and 6b is shifted by 45° as seen in FIG. 6. Slide member 4A' having angle shaped corner slide portions 40, 41, 42 and 43 moves up and down along guide elements 50, 51, 52 and 53 formed on base 2', as shown in FIG. 6. Contact makers 6 are disposed inside slide member 4A' in such a way that the opening and closing directions of arms 6a and 6b is shifted by 45° relative to each side of slide member 4A'. The angle shaped slide parts 40, 41, 42 and 43 along with inclined surfaces 40b, 41b, 42b and 43b, vertical surfaces is 40c, 41c, 42c and 43c and supporting surfaces 40d, 41d, 42d and 43d are provided as in the case of the FIGS. 1–5 embodiment. Although not shown in the drawings, a loading surface for the loading of BGA package 5 is similarly provided on the guide elements 50 and 52. According to the FIGS. 6–8 embodiment, arms 6a and 6b of the contact makers 6 may be arranged closer together. As a result of this, there is an advantage in that the socket can be used for BGA package leads having smaller pitches. The other structural and functional effects are the same as in the above described embodiment.

Therefore, its details will be omitted from this description.

FIGS. 9(a) through 9(c) show still another embodiment of a socket made according to the invention which will be described by using the same reference characters for the parts which correspond to the above described embodiments. In the FIGS. 9(a) through 9(c) embodiment, socket 1B comprises cover 3" and slide actuator member 4" which are formed integrally so that the means for separately moving slide actuator member 4" is eliminated. An inclined surface 3e for guiding BGA package 5 and a vertical positioning surface 3f for positioning package 5 are formed on the sidewall of the opening portion 3a of cover 3" which is vertically movable relative to base 2". Contact makers 6, the same as those described in the first embodiment above, are mounted on base 2". A lattice part 4b" is provided on slide actuator member 4" and a respective 10 contact maker 6 is inserted into each aperture 4a" which is formed thereby. In addition, a supporting surface 4c is formed on slide actuator member 4" for the placement of BGA package 5 and, although not shown, a loading surface is formed on base 2". When cover 3 is situated at its upper extremity, the slide actuator member 4" is also situated at an upper extremity with a respective lattice part 4b" being located above the bent part of one of arms 6a of each contact maker 6 and with arms 6a and 6b of each contact maker 6 closed. When the cover is lowered from this state, the lattice parts 4b" of the slide actuator member 4" engage arms 6b of contact makers 6, with a result that arms 6a and 6b open. When BGA package 5 is dropped through opening portion 3a of cover 3", BGA package 5 is placed on the placing surface 4c of the slide actuator member 4" and is positioned at a preselected position. When the cover 3 is further lowered, slide actuator member 4" also comes down in conformity with it. In a manner similar to the operation of the above described first embodiment, BGA package 5 is moved from the supporting surface 4c of the elevating member 4" to the loading surface (not shown) of base 2" and solder balls 5b of the BGA package 5 are inserted between respective arms 6a and 6b. When the cover 3" is lowered until it touches the base 2", as shown in FIG. 9(c), engagement between the lattice parts 4b" of the slide actuator member 4" and arms 6a and 6b are closed. Because of this, each solder ball 5b of the BGA package 5 is compressively held by respective arms 6a and 6b, thereby effecting electrical connection between solder balls 5b of the BGA package 5 and contact makers 6. According to this embodiment, the gear for movement of the elevating member 4", therefore, can be eliminated for an added simplification of the construction.

Figures 10A, 10B, 10C:
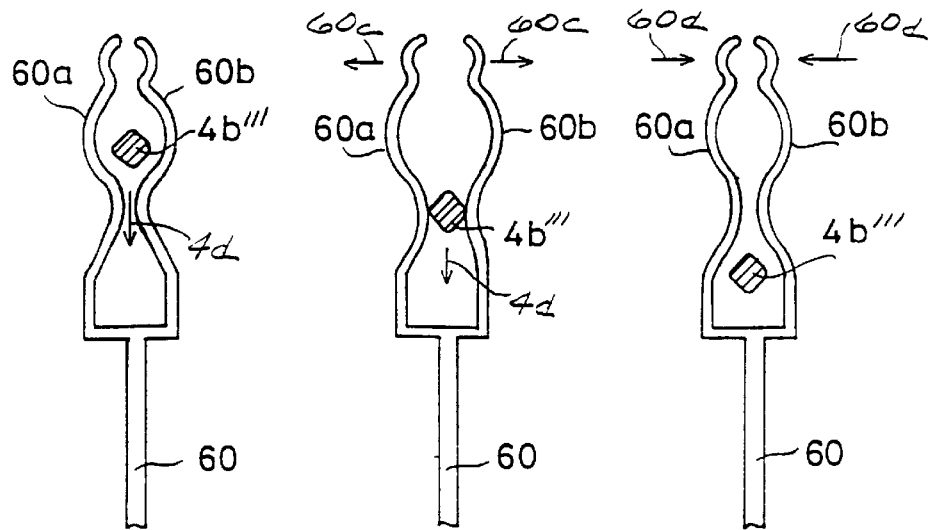
FIGS. 10(a) through 10(c) show a modified contact maker and a related actuating member in alternate positions for a variation of the FIG. 9 socket.
Figure 11:
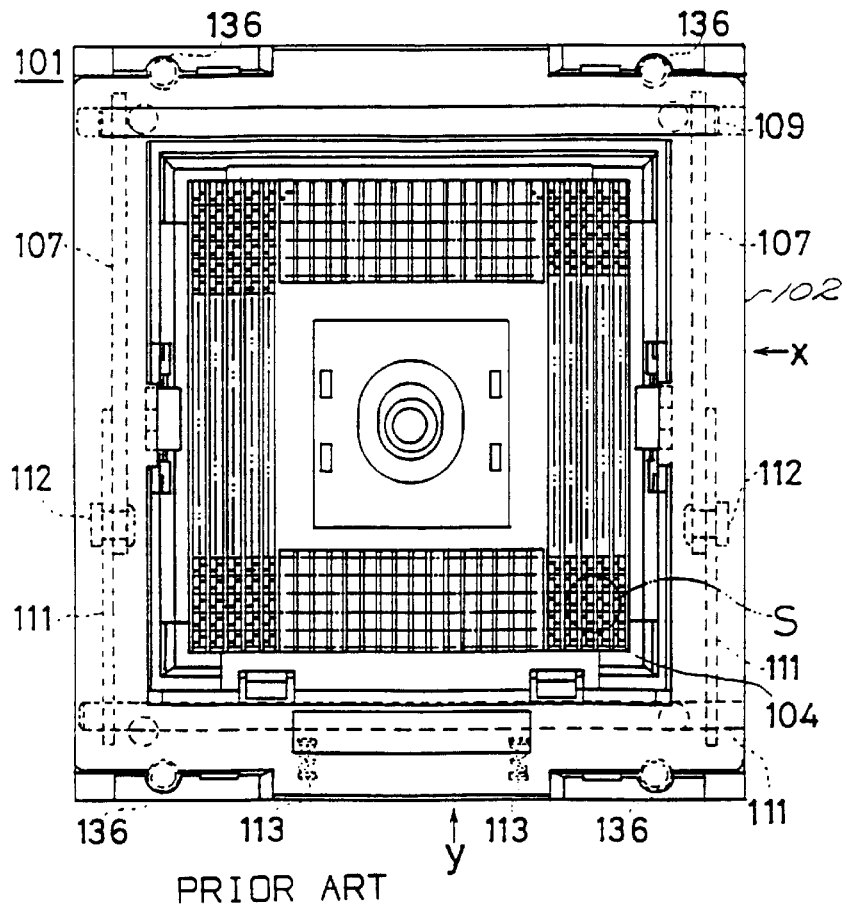
FIG. 11 is a top plan view of a conventional socket for a BGA package.
Figure 11A:
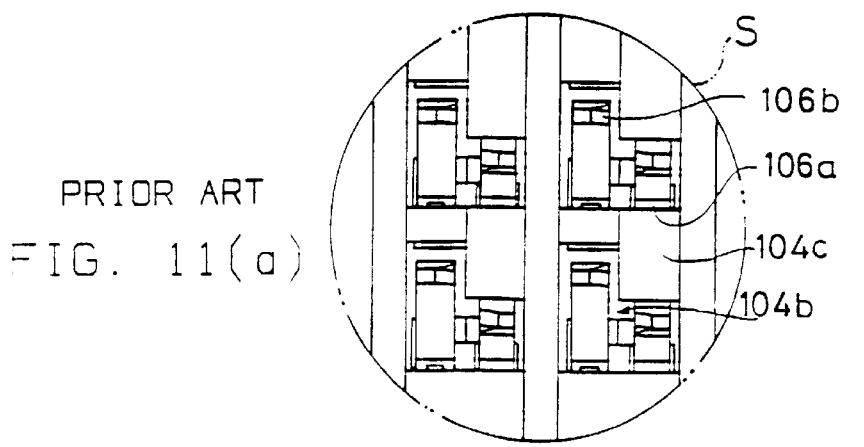
FIG. 11(a) is an enlarged view showing the dashed line portion S in FIG. 11.
Figure 12:
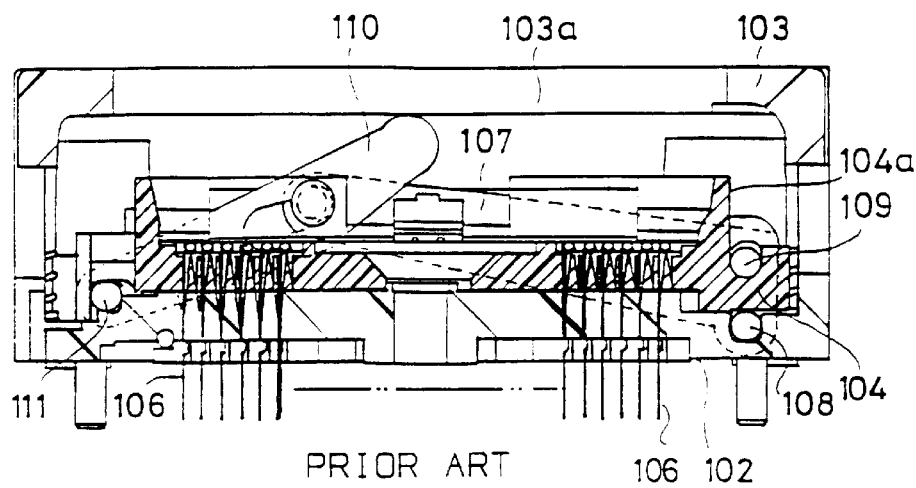
FIG. 12 is a partial cross section of the socket shown in FIG. 11.
Figure 13:
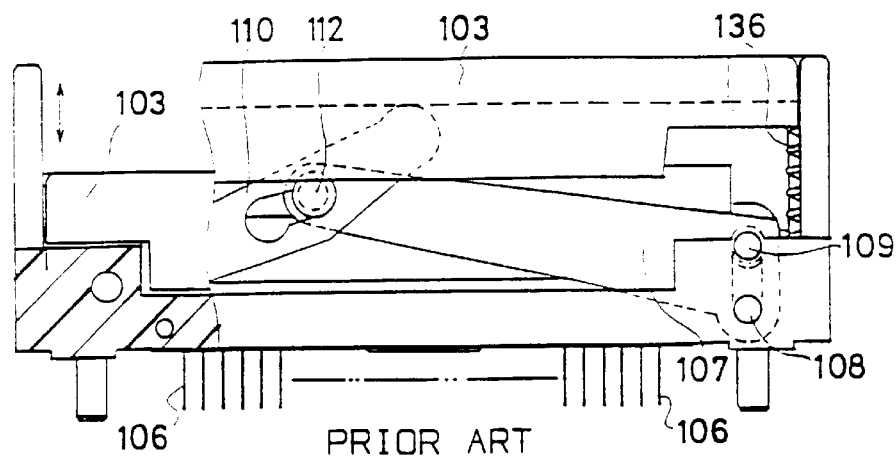
FIG. 13 is an elevational view, partly in cross section, from the X direction of the socket shown in FIG. 11 and showing the cover in two alternate positions.
Figure 14:
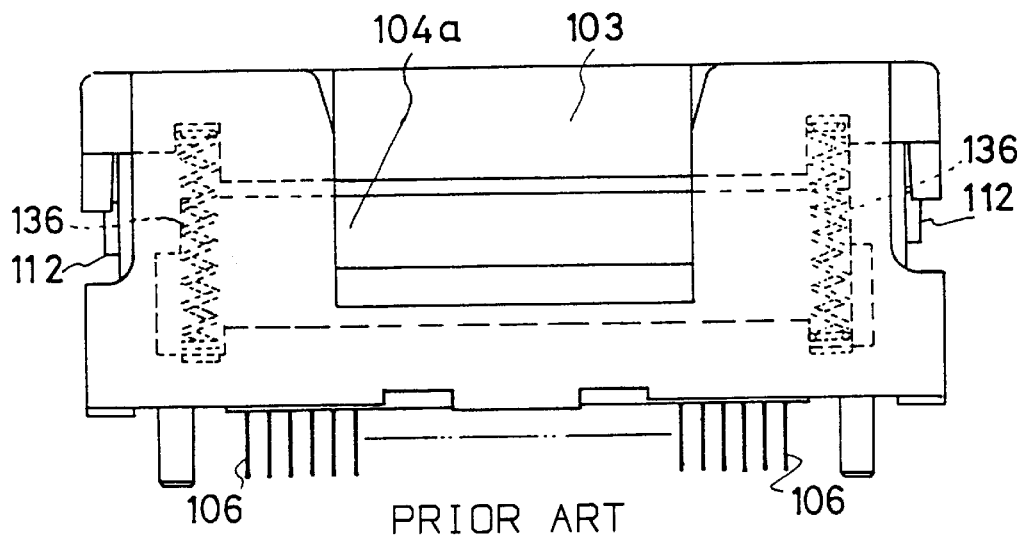
FIG. 14 is an elevational view from the y direction of the socket shown in FIG. 11.
Figure 15A:
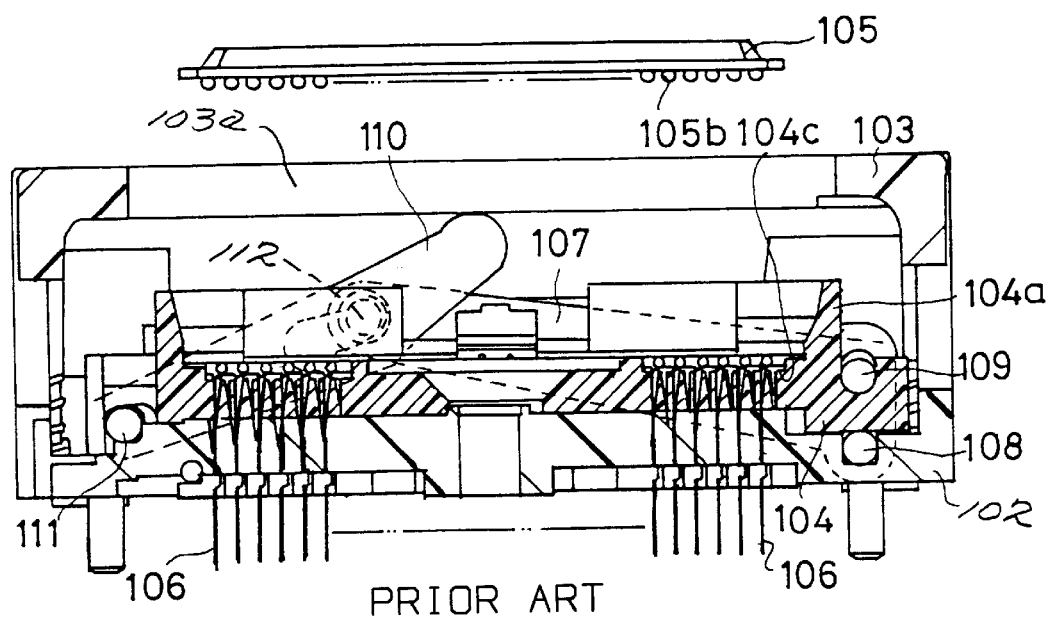
FIGS. 15(a) through 15(c) are views similar to FIG. 12 showing the socket in alternate positions.
Figure 15B:
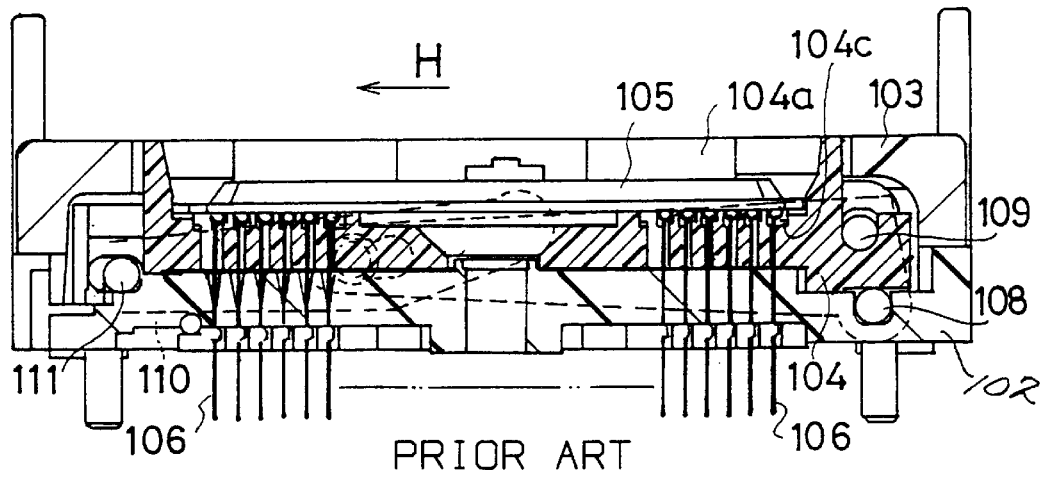
Figure 15C:
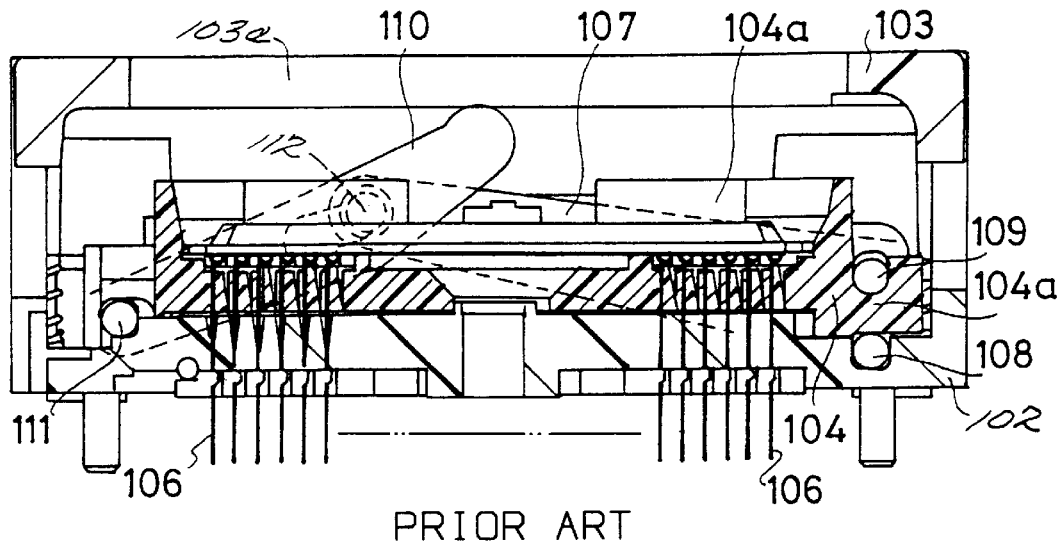

FIG. 10 shows a modified contact maker useful in the above embodiments of the invention. As shown in FIG. 10(a) through 10(c), contact maker 60 has a pair of arms 60a and 60b with a constriction formed at the center thereof. A respective lattice part 4b'" of the slide actuator member is inserted between arms 60a and 60b. As the lattice parts 4b'" move (arrow 4d) and the constricted parts of arms 60a and 60b are biased apart (FIG. 10(b)) or released (FIGS. 10(a), 10(c)), the arms 60a and 60b can be opened (arrows 60c) or closed (arrows 60d).

This invention can be used not only in sockets for burn-in tests but also in sockets for various electrical property tests and can be used with packages having various kinds of lead terminals, provided that holding can be effected by using contact parts in the shape of arms. For example, the invention can be used with PGA packages (pin grid array). Although contact makers are shown having pin type portions for connection with circuit substrates, other forms can be employed, such as solder balls.

According to the invention which has been described above, an electric part can be mounted smoothly and firmly without the danger of terminal leads of the electric part being unintentionally inserted into or between adjacent contact parts. As a result of the above, connection can easily be carried for IC packages having fine pitches. Even in the case where the terminal lead of an electric part and the arm-shaped contact parts are fused in connection with the removal of the electric part, moreover, they can be easily separated from each other, thereby making it possible to remove the electric part smoothly. In the case of this invention, moreover, there is no need to use a link mechanism as in the prior art, with a result that the construction can be simplified and the number of the parts can be reduced, thereby contributing toward a reduction in size and in manufacturing cost.

It should be understood that although preferred embodiments of the invention have been described in order to illustrate the invention, the invention includes various modifications and equivalents to the disclosed embodiment, only some of which have been mentioned above. It is intended that the invention include all such modifications and equivalents falling within the scope of the appended claims.

What is claimed:

1. Socket apparatus for removably mounting an electronic package having a plurality of leads arranged in a selected pattern comprising a base having a bottom wall, a cover having a centrally disposed opening therethrough received on the base and being movable toward and away from the bottom wall, spring members mounted on the base biasing the cover away from the bottom wall, an actuator member aligned with the opening in the cover and movably mounted on the base toward and away from the bottom wall between lower and upper positions and being interconnected with the cover, the actuator member having a bottom portion having a grid forming a plurality of contact receiving apertures therethrough, the actuator member having electronic package supporting surfaces thereon, a plurality of elongated contacts mounted in the bottom wall, the contacts each having a pair of arms relatively movable between open and closed contact positions extending upwardly from the bottom wall, each pair of arms received through apertures in the grid biasing the arms to one of the open and closed contact positions when the actuator member is in the lower position, and electronic package loading surfaces formed on the base disposed at a location between the lower and upper positions of the electronic package supporting surfaces of the actuator member as it moves toward and away from the base and interdigitated with the electronic package supporting surfaces of the actuation member, the electronic package being received on the electronic supporting surfaces when the actuator member is in the upper position and being transferred to the electronic package mounting surfaces as the actuator member moves to its lower position.

2. Socket apparatus according to claim 1 which the electronic package supporting surfaces are spaced sufficiently above the contacts so as to maintain the leads of an electronic package mounted thereon out of engagement with the contacts when the actuator is disposed at the upper position.

3. Socket apparatus according to claim 2 in which the actuator member is formed integrally with the cover.

4. Socket apparatus according to claim 2 further comprising rack and pinion gears interconnecting the cover, base and actuator member to move the actuator member away from the bottom wall when the cover is moved toward the bottom wall against the bias of the spring members and to move the actuator member toward the bottom wall when the cover member moves away from the bottom wall.

5. Socket apparatus according to claim 4 in which rack gears are mounted on the cover and the actuator member and at least one pinion gear is mounted on the base engaged with the rack gears.

6. Socket apparatus according to claim 5 in which two pairs of rack gears are mounted on spaced apart portions of the cover, a pair of rack gears are mounted on spaced apart portions of the actuator member and a pair of spaced apart pinion gears are mounted on the base, one pinion gear engaging one pair of rack gears on the cover and one rack gear on the actuator member and the other pinion gear engaging the other pair of rack gears on the cover and the other rack gear on the actuator member.

7. Socket apparatus according to claim 5 in which the pinion gear has a first diameter portion having a selected number of teeth engaged with the rack gear mounted on the cover and a second different diameter portion having a selected different number of teeth engaged with the rack gear mounted on the actuator member.

8. Socket apparatus according to claim 7 in which the pair of arms of each contact are both received through the same contact receiving aperture.

9. Socket apparatus according to claim 7 in which each arm of a pair is received through separate contact receiving apertures.

10. Socket apparatus according to claim 1 in which the actuator member has a vertically extending positioning surface adjacent to the electronic supporting surface for positioning electronic packages.

11. Socket apparatus according to claim 10 further comprising inclined guiding surfaces formed on the actuator member leading to the positioning surfaces.

12. Socket apparatus according to claim 10 for further comprising inclined guiding surfaces formed on the base leading to the loading surfaces for precisely positioning electronic packages upon being transferred from the support surfaces.

* * * * *